United States Patent [19]

Münzel et al.

[11] Patent Number: 5,627,011

[45] Date of Patent: May 6, 1997

[54] HIGH RESOLUTION I-LINE PHOTORESIST OF HIGH SENSITIVITY

[75] Inventors: Norbert Münzel, Heitersheim; Reinhard Schulz, Staufen-Wettelbrunn; Heinz Holzwarth, Bad Krozingen, all of Germany; Stephan Ilg, Giebenach, Switzerland

[73] Assignee: Ciba-Geigy Corporation, Tarrytown, N.Y.

[21] Appl. No.: 440,388

[22] Filed: May 12, 1995

Related U.S. Application Data

[63] Continuation of Ser. No. 61,652, May 13, 1993.

[30] Foreign Application Priority Data

May 22, 1992 [CH] Switzerland .............. 1656/92
Oct. 29, 1992 [CH] Switzerland .............. 3368/92

[51] Int. Cl.$^6$ ................................ G03F 7/038
[52] U.S. Cl. .............. 430/270.1; 430/909; 430/910; 430/919; 430/921; 430/922; 522/59; 522/49; 522/53; 522/116; 522/126; 522/57
[58] Field of Search ................. 430/270, 325, 430/909, 910, 919, 921, 922; 522/59, 49, 53, 116, 126, 57

[56] References Cited

U.S. PATENT DOCUMENTS

| | | | |
|---|---|---|---|
| 4,113,497 | 9/1978 | Schlesinger | 522/67 |
| 4,540,598 | 9/1985 | Berner et al. | 427/54.1 |
| 4,939,069 | 7/1990 | Kawabata et al. | 430/281 |
| 5,118,582 | 6/1992 | Ueno et al. | 430/270 |
| 5,210,003 | 5/1993 | Schädeli | 430/270 |

FOREIGN PATENT DOCUMENTS

| | | | |
|---|---|---|---|
| 0139609 | 5/1985 | European Pat. Off. | |
| 0241423 | 10/1987 | European Pat. Off. | |
| 0329610 | 8/1989 | European Pat. Off. | |
| 0361906 | 4/1990 | European Pat. Off. | |
| 0361907 | 4/1990 | European Pat. Off. | 430/270 |
| 0475903 | 3/1992 | European Pat. Off. | |
| 1-293339 | 11/1989 | Japan | 430/270 |

OTHER PUBLICATIONS

SPIE, vol. 920, Advances in Resist Technology and Processing V (1988) pp. 60–66 Mckean et al.
Polymer, 1983, vol. 24, pp. 995–1000 T.M.T Frechet et al "Poly(p–tert–butoxycarbonyloxystyrene): a convenient precursor to p–hydroxystryene".

Ullmanns Encyclopedia of Chemical Technology, 4th Ed., vol. 15, pp. 613–629 1978.

Derwent Abstract WPI Acc No: 89–243491/34 of EP 329610 Aug. 23, 1989.

Derwent Abstract WPI Acc No: 87–286243/41 of EP 241423 Oct. 14, 1987.

Primary Examiner—Cynthia Hamilton
Attorney, Agent, or Firm—William A. Teoli, Jr.; David R. Crichton

[57] ABSTRACT

The invention relates to the use of oxime sulfonates of formula 1

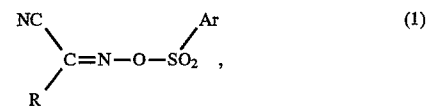

wherein

R is naphthyl,

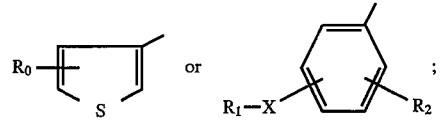

Ar is an unsubstituted aryl group or an aryl group which carries one or more than one substituent selected from the group consisting of nitro, chloro, bromo, hydroxyl, $C_1$–$C_4$alkyl, $C_1$–$C_4$perfluoroalkyl, $C_1$–$C_4$alkoxy and acid degradable substituents;

$R_0$ is either a $R_1$—X group or $R_2$;

X is an oxygen or a sulfur atom;

$R_1$ is hydrogen, $C_1$–$C_4$alkyl or unsubstituted phenyl or phenyl which is substituted by a member selected from the group consisting of chloro, bromo, $C_1$–$C_4$alkyl and $C_1$–$C_4$alkoxy, and $R_2$ is hydrogen, $C_1$–$C_4$alkyl or an acid-degradable substituent, as radiation-sensitive photoacid generator in a chemically amplified photoresist which is developable in alkaline medium and is sensitive to radiation of a wavelength in the range from 340–390 nm, and to corresponding positive-working and negative-working photoresists for the cited wavelength range.

6 Claims, No Drawings

HIGH RESOLUTION I-LINE PHOTORESIST OF HIGH SENSITIVITY

This application is a continuation of application Ser. No. 08/061,652, filed May 13, 1993.

The present invention relates to the use of specific oxime sulfonates, i.e. compounds containing the structural unit

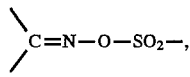

as radiation-sensitive photoacid generator, in a chemically amplified photoresist which is developable in alkaline medium, to corresponding positive- and negative-working photoresists, and to a process for the production of images using such resists.

A chemically amplified photoresist will be understood as meaning a resist composition the radiation-sensitive component of which, when exposed to radiation, generates solely the amount of acid necessary to catalyse a chemical reaction of at least one acid labile component of the resist by means of which the final differences in solubility between exposed and unexposed areas of the photoresist result.

Industrial resist formulations based on a large number of radiation-sensitive oxime sulfonates and conventional acid-curable resins are disclosed in EP-A-0 139 609 (=U.S. Pat. No. 4,540,598). These resist formulations are cured firstly with actinic light, especially with light in the range of 250–400 nm. The oxime sulfonates generate acid, so that a thermal cure in which the material also becomes insoluble in customary solvents is able to take place even at quite low temperatures. Nothing can be inferred about an imagewise exposure of corresponding resist films or about related problems as well as the image properties of the numerous formulations falling within the generic scope of the teaching of this patent specification.

Conventional positive photoresist compositions based on oxime sulfonates and alkali-soluble binders, typically cresol novolaks or hydroxymethacrylate-acrylic acid copolymers, are also known and disclosed in EP-A-0 241 423. According to this reference, radiation of 200–600 nm can be used for exposing the resists. The shortcoming of these photoresists is, however, that resolution and sensitivity are simultaneously never altogether satisfactory. This is particularly the case upon exposure to radiation in the range of the mercury i-line, which has a wavelength of 365 nm and is often used for the imagewise exposure of resist films, because mercury medium- and high-pressure lamps are inexpensive sources of radiation for producing radiation of these wavelengths with good intensity.

In the article "Photochemistry of Imino Sulfonate Compounds and Their Application to Chemically Amplified Resists" by Masamitsu Shirai and Masahiro Tsunooka; Journal of Photopolymer Science and Technology, Vol. 3(3), 1990, pp. 301–304, there are also disclosed chemically amplified photoresist compositions based on oxime sulfonates as photoacid generating compounds and poly(p-tert-butoxycarbonyloxystyrene) as acid labile component. The styrene component decomposes, catalysed by the acid generated by the acid generator upon exposure to irradiation to form poly(p-hydroxystyrene). This results in the exposed areas becoming soluble in alkaline developers so that positive images can be obtained with such developers. The described oxime sulfonates have an absorption maximum of c. 250 nm in the UV/VIS spectrum, but have only low absorption for radiation of 313 nm and higher wavelength.

Thus only a low sensitivity of the compositions to 313 nm radiation was found.

It is the object of this invention to provide photoresist compositions which have excellent resolution coupled with excellent sensitivity. These properties shall be observed especially when the resist compositions are exposed to radiation in the range of the mercury i-line, which has a wavelength of c. 365 nm.

Surprisingly, this object is achieved by using oxime sulfonates of formula I below which have been specially chosen with respect to the chromophoric part of the molecule as photoacid generators in chemically amplified photoresist compositions which are developable in aqueous-alkaline media. This applies both to corresponding negative-working as well as to positive-working photoresists containing an acid-labile component that undergoes an acid-catalyzed chemical reaction which changes the solubility of the compositions in aqueous-alkaline developers.

Accordingly, the invention relates to the use of oxime sulfonates of formula 1

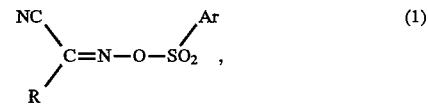

wherein

R is naphthyl,

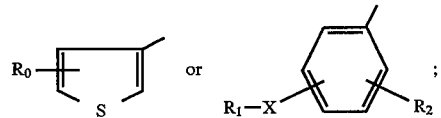

Ar is an unsubstituted aryl group or an aryl group which carries one or more than one substituent selected from the group consisting of nitro, chloro, bromo, hydroxyl, $C_1$–$C_4$alkyl, $C_1$–$C_4$perfluoroalkyl, $C_1$–$C_4$alkoxy and acid-degradable substituents;

$R_0$ is either a $R_1$—X group or $R_2$;

X is an oxygen or a sulfur atom;

$R_1$ is hydrogen, $C_1$–$C_4$alkyl or unsubstituted phenyl or phenyl which is substituted by a member selected from the group consisting of chloro, bromo, $C_1$–$C_4$alkyl and $C_1$–$C_4$alkoxy, and $R_2$ is hydrogen, $C_1$–$C_4$alkyl or an acid-degradable substituent, as radiation-sensitive photoacid generator in a chemically amplified photoresist which is developable in alkaline medium and is sensitive to radiation in the range from 340 to 390 nanometers.

The invention further relates to a chemically amplified photoresist which is developable in alkaline medium and is sensitive to radiation in the range from 340 to 390 nanometers, which photoresist is based on oxime sulfonates as radiation-sensitive acid generators and contains a compound of formula 1 as defined above as oxime sulfonate.

These resists encompass chemically amplified, positive-working photoresists which are developable in alkaline medium and are sensitive to radiation in the range from 340 to 390 nanometers, which resists are based on oxime sulfonates as radiation-sensitive acid generators and contain a compound of formula 1 as defined above as oxime sulfonate, wherein Ar, X, R, $R_0$, $R_1$ and $R_2$ have the meanings assigned to them above.

Another embodiment of the invention relates to chemically amplified, negative-working photoresists which are developable in alkaline medium and are sensitive to radiation in the range from 340 to 390 nanometers, which resists are based on oxime sulfonates as radiation-sensitive acid generators and contain a compound of formula 1 as defined above as oxime sulfonate, wherein R, $R_0$ and X have the meanings assigned to them above, and Ar is an unsubstituted aryl group or an aryl group which carries one or more than one nitro, chloro, bromo, hydroxyl, $C_1$–$C_4$alkyl, $C_1$–$C_4$perfluoroalkyl or $C_1$–$C_4$alkoxy substituent; $R_1$ is hydrogen, $C_1$–$C_4$alkyl or unsubstituted phenyl or phenyl which is substituted by a member selected from the group consisting of chloro, bromo, $C_1$–$C_4$alkyl and $C_1$–$C_4$alkoxy, and $R_2$ is hydrogen or $C_1$–$C_4$alkyl.

Both embodiments of the inventive photoresists are readily able to resolve structural units having dimensions in the submicron range, typically structures having dimensions down to 0.3 μm, the radiation used being the range of c. 340–390 nm. The resist structures remaining on the substrate after development exhibit in addition very good contrast. The resists further have superior lithographic sensitivity to the given radiation. This feature was especially unexpected, as the oxime sulfonates chosen as acid generators absorb radiation of this wavelength only to an extremely low extent. The novel photoresists therefore match deep UV resists as regards lithographic properties, but have the advantage that they work with radiation of the near UV range with which it is possible to effect exposure technically very much easier.

The symbol "Ar" in formula 1 generally denotes chemical groups containing aromatic rings. These groups preferably contain 6 to 12 ring carbon atoms. Preferably Ar may be unsubstituted phenyl or phenyl that carries one or more than one chloro, bromo, hydroxyl, $C_1$–$C_4$alkyl, $C_1$–$C_4$perfluoroalkyl, $C_1$–$C_4$alkoxy or acid-degradable substituent, or unsubstituted naphthyl or naphthyl substituted as for phenyl, or correspondingly substituted groups of the type

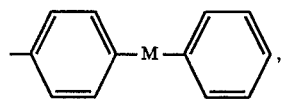

where M may be either a direct single bond or of the following groups: —S—; —O—; —SO—; —SO$_2$—; —CO—; —C($R_5$)($R_6$)—, where $R_5$ may be hydrogen, methyl or aryl and $R_6$ may be hydrogen or methyl. $C_1$–$C_4$Alkyl, $C_1$–$C_4$perfluoroalkyl and $C_1$–$C_4$alkoxy can have one of the meanings given for $R_1$ and $R_2$.

$R_1$ and $R_2$ as $C_1$–$C_4$alkyl may each independently of the other be preferably methyl, ethyl, n-propyl, isopropyl, n-butyl, isobutyl, sec-butyl, tert-butyl; and as $C_1$–$C_4$perfluoroalkyl may preferably be completely fluorinated radicals derived from the cited alkyl radicals; and as $C_1$–$C_4$alkoxy may preferably be methoxy, ethoxy, n-propoxy, isopropoxy, n-butoxy, isobutoxy, sec-butoxy or tert-butoxy.

The compounds of formula 1 which contain acid degradable groups can be used as acid generators for positive-working photoresists. Particularly suitable acid-degradable substituents are groups of the following formulae (2) to (6):

—O—R$_7$, (2)

wherein R$_7$ is a hydrocarbon radical, typically an aralkyl or a $C_1$–$C_4$alkyl radical, preferably benzyl and tert-butyl;

wherein R$_8$ is a hydrocarbon radical, typically an aralkyl or a $C_1$–$C_4$alkyl radical, preferably benzyl and $C_1$–$C_4$alkyl such as ethyl or tert-butyl;

wherein Z is either silicon or carbon;

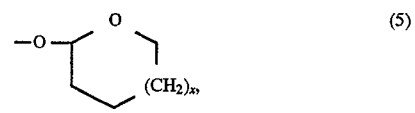

wherein x is either 0 or 1; or

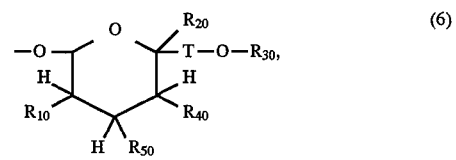

wherein $R_{10}$ is hydrogen, halogen, alkyl, cycloalkyl, aryl, alkoxy or aryloxy, $R_{20}$ is hydrogen, alkyl, cycloalkyl or aryl, $R_{30}$ is a saturated or unsaturated hydrocarbon radical, $R_{40}$ and $R_{50}$ are each independently of the other hydrogen, halogen, alkyl, alkoxy or aryloxy, and T is a direct single bond or a methylene or ethylene bridge. Protective groups of formula (6) are disclosed in EP-A-0 475 903. The preferred meanings given therein for $R_{10}$, $R_{20}$, $R_{30}$, $R_{40}$, $R_{50}$ and T also apply in the present case.

Compounds of formula (1) containing the cited acid degradable groups can be prepared by known methods from the compounds that carry hydroxyl substituents at the appropriate position.

Preferred photoresists of this invention contain oxime sulfonates of formula

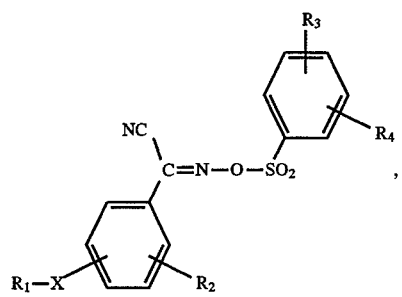

wherein X is an oxygen or a sulfur atom, $R_1$ is hydrogen, phenyl or $C_1$–$C_4$alkyl, $R_2$ and $R_3$ are each independently of the other hydrogen or $C_1$–$C_4$alkyl, and $R_4$ is hydrogen, chloro, bromo, hydroxyl, trifluoromethyl or $C_1$–$C_4$alkyl.

Among this group, those photoresists are preferred wherein X is an oxygen atom, $R_1$ is a $C_1$–$C_4$alkyl radical, preferably methyl or ethyl, or phenyl, and $R_2$, $R_3$ and $R_4$ are each independently of one another hydrogen or methyl. Most preferably, $R_2$ and $R_3$ are hydrogen atoms and $R_4$ is a methyl group.

Also preferred are photoresists that contain compounds of formula (1) as acid generator wherein R is

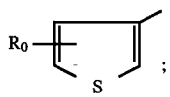

Ar is an aryl group of formula

wherein $R_3$ and $R_4$ have one of the meanings mentioned above and $R_0$ is hydrogen.

Also included are photoresists which contain a compound of formula (1), wherein R is

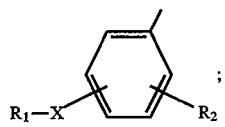

Ar is an aryl group of formula

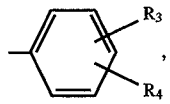

X is an oxygen atom, $R_1$ is $C_1$–$C_4$alkyl or phenyl, and $R_2$, $R_3$ and $R_4$ are each independently of one another hydrogen, chloro or methyl.

Also preferred are photoresists which contain a compound of formula (1), wherein R is

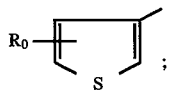

Ar is an aryl group of formula

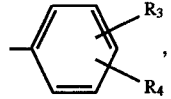

$R_3$ and $R_4$ are each independently hydrogen, chloro or methyl and $R_0$ is hydrogen.

As already mentioned, the difference in solubility between exposed and unexposed areas which results from the acid-catalyzed reaction of the resist material during or after exposure of the resist can be of two kinds, depending on which further components the resist contains. If the novel compositions contain components that increase the solubility of the composition in the developer, then the resist is positive-working. But if these components reduce the solubility of the composition, then the resist is negative-working.

Acid-labile components that induce negative working are in particular compounds which, when catalyzed by acid (formed upon exposure of compound 1), are able to undergo a crosslinking reaction with themselves or with one or more than one additional component in the composition. Compounds of this type include the known acid-curable resins such as acrylic, polyester, alkyd, melamine, urea, epoxy and phenolic resins or mixtures thereof. Amino resins, phenolic resins and epoxy resins are very suitable. Such acid-curable resins are commonly known and described, inter alia, in Ullmann's Encyclopedia of Industrial Chemistry, 4th Edition, Vol. 15(1978), pp. 613–628. They will normally be present in a concentration of 2 to 40% by weight, preferably 5 to 30% by weight, based on the total solids content of the negative-working composition.

Very particularly preferred acid-curable resins are amino resins such as free or etherified melamine, urea, guanidine or biuret resins, preferably methylated melamine resins or butylated melamine resins, corresponding glucorils and urones. Resins will be understood in this context as meaning both the conventional technical mixtures which usually also contain oligomers, as well as the pure and ultrapure defined compounds. N-Methoxymethylmelamine (formula 7) as well as tetramethoxymethyl glucoril (formula 8) and N,N'-dimethoxymethyluron (formula 9) are the most preferred acid-curable resins

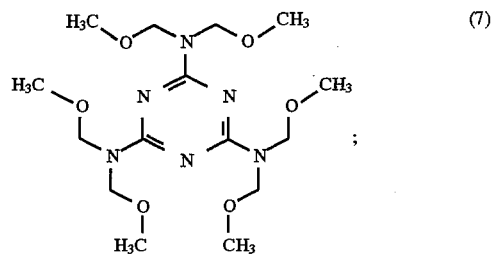

(7)

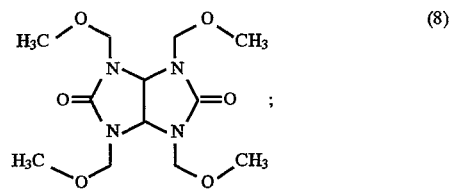

(8)

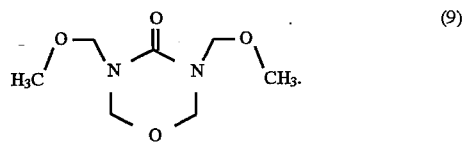

(9)

The concentration of compound of formula (1) in negative resists is normally 0.1 to 30% by weight, preferably to 20% by weight, likewise based on the total solids content of the compositions. The most preferred concentration is from 1 to 15% by weight.

In some cases the negative-working resist compositions may additionally contain a film-forming polymeric binder. This binder is preferably an alkali-soluble phenolic resin. Such resins are very suitably novolaks derived from an aldehyde, typically acetaldehyde or furfuraldehyde, but preferably from formaldehyde, and a phenol, typically unsubstituted phenol, monochloro- or dichloro-substituted phenol such as p-chlorophenol, mono- or di-$C_1$–$C_9$alkyl-substituted phenol such as o-, m- or p-cresol, the different xylenols, p-tert-butylphenol, p-nonylphenol, p-phenylphenol, resorcinol, bis(4-hydroxyphenyl)methane or 2,2-bis(4-hydroxyphenyl)propane. Suitable binders are homo- and copolymers of ethylenically unsaturated phenols, for example homopolymers of vinyl- and 1-propenyl-substituted phenols, such as p-vinylphenol or p-(1-propenyl) phenol, or copolymers of these phenols with one or more than one ethylenically unsaturated material, typically styrene. The amount of binder will normally be from 30 to 90% by weight or, preferably, from 40 to 80% by weight.

Accordingly, a special embodiment of the invention relates to negative-working photoresists which are developable in alkaline medium and are sensitive to radiation in the wavelength range of 340–390 nm, which resists contain an oxime sulfonate of formula (1) as defined above but does not contain any acid degradable groups, an alkali-soluble phenolic resin binder and a component which, when acid-catalyzed, undergoes a crosslinking reaction with itself and/or with the binder.

A particularly preferred embodiment of these negative photoresists contains 1 to 15% by weight of oxime sulfonate, 40 to 80% by weight of a phenolic resin binder, for example one of those referred to above, and 5 to 30% by weight of an amino resin, preferably of a melamine resin as crosslinking agent, the percentages being based on the solids content of the composition. A negative resist with particularly good properties is obtained using a novolak or, preferably, polyvinyl phenol as binder.

In addition to the oxime sulfonates of formula (1) containing one or more than one acid-degradable group, monomers or polymers that are insoluble in alkali but in the presence of acid are cleaved or are able to undergo intramolecular rearrangement to form reaction products that are soluble in a conventional alkaline developer and/or induce the solubility in the developer of an additional binder which is otherwise alkali-insoluble and acid-resistant, also induce positive working in the photoresist compositions of this invention. Such compounds are hereinafter referred to as dissolution inhibitors.

A further special embodiment of the invention thus relates to positive-working photoresists which are developable in alkaline medium and are sensitive to radiation in the wavelength range of 340–390 nm, which photoresists contain a compound of formula (1) that does not carry any acid-degradable substituents, and at least one compound which substantially prevents the solubility of the composition in an alkaline developer but which, in the presence of acid, can be cleaved so as to form reaction products that are soluble in the developer and/or induce the solubility of an acid-resistant binder additionally present, in the developer, which binder is otherwise substantially insoluble in said developer.

Dissolution inhibitors which may suitably be used in this embodiment of the invention are organic monomers and polymers containing functional groups that would intrinsically be alkali-soluble, for example containing aromatic hydroxyl groups, carboxyl groups, secondary amino groups and keto or aldehyde groups, but which have undergone chemical change by reaction with a suitable compound such that they are insoluble in aqueous alkali, and the protective groups formed during said reaction can be cleaved again under acid catalysis such that the functional groups are restored in their original form.

Suitable for protecting hydroxyl groups, carboxyl groups or secondary amino groups are typically dihydrofuran or 3,4-dihydropyran and their derivatives, benzyl halides, alkyl halides, haloacetic acid, haloacetates, chlorocarbonates, alkylsulfonyl halides, aromatic sulfonyl halides, dialkyl dicarbonates or trialkylsilyl halides, and the reactions can be carried out in known manner. A customary conversion into ketals and acetals is suitable for protecting keto and aldehyde groups.

Compounds carrying blocked aromatic hydroxyl groups are especially preferred, which compounds may likewise be monomers as well as polymers. The aromatic monomers preferably contain one or more than one aromatic nuclei, preferably two to six aromatic nuclei, containing 6 to 14, preferably 6, ring carbon atoms. In addition to containing the blocked hydroxyl groups, the aromatic nuclei may of course contain further substituents, preferably $C_1$–$C_4$alkyl, $C_1$–$C_4$alkoxy or halogen. Particularly preferred monomer dissolution inhibitors are bisphenyl types, i.e. compounds of formula

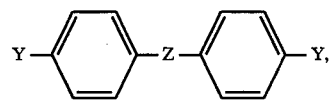

wherein each Y is a group of formula (2) to (6), and Z is either a direct single bond or may be one of the following groups: —S—; —O—; —SO—; —SO$_2$—; —CO—; —C(R$_5$)(R$_6$)—, where R$_5$ may be hydrogen, methyl or aryl, and R$_6$ may be hydrogen or methyl. Particularly preferred divalent radicals —C(R$_5$)(R$_6$)— are —CH$_2$—; —C(CH$_3$)$_2$— and —C(CH$_3$)(Ph)—. The preferred polymeric dissolution inhibitors are derived from customary phenolic resins, typically from polyvinyl phenols the hydroxyl groups of which are also blocked in a manner consistent with formulae (2) to (6) above. Dissolution inhibitors carrying protective groups of the indicated kind are known in the art. Inhibitors carrying groups of formula (3) are described, inter alia, by Dennis R. McKean, Scott A. McDonald, Nicholas J. Clecak and C. Grant Willson in "Novolac based resists", SPIE Vol. 920 Advances in Resist Technology and Processing V (1988), pp. 60–63, or by Masamitsu Shirai and Masahiro Tsunooka in "Photochemistry of Imino Sulfonate Compounds and their Application to Chemically Amplified Resists", Journal of Photopolymer Science and Technology, Vol. 3(3), 1990, pp. 301–304. They can be prepared by standard known methods, for example as described by J. M. J. Frechet, E. Eichler, H. Ito and C. G. Willson, Polymer 24 (1983), pp. 995. Dissolution inhibitors carrying substituents of formula (4) are disclosed in EP-A-0 329 610; inhibitors carrying protective groups of formula (5) are described, inter alia, by N. Hayashi, S. M. A. Hesp, T. Ueno, M. Toriumi, T. Iwayanagi and S. Nonogaki in Polym. Mat. Sci. Eng. 61 (1989), pp. 417–421; and aromatic compounds carrying groups of formula (6) are described in more detail in EP-A-0 475 903. The protective groups of formulae (4) and (5) can be obtained in known manner by addition of 3,4-dihydropyrans or 3,4-dihydrofurans under acid conditions.

In positive resists of the indicated type, a film-forming polymeric dissolution inhibitor can be either the sole binder of the photoresist or be used in admixture with an acid-resistant binder and optionally a monomeric dissolution inhibitor.

Illustrative examples of acid-resistant binders are novolaks, preferably derived from o-, m- or p-cresol and formaldehyde, also poly(p-hydroxystyrene), poly(p-hydroxy-α-methylstyrene) and copolymers of p-hydroxystyrene, p-hydroxy-α-methylstyrene and acetoxystyrene.

Illustrative examples of polymeric dissolution inhibitors are novolaks, preferably derived from o-, m- or p-cresol and formaldehyde, poly(p-hydroxystyrene), poly(p-hydroxy-α-methylstyrene), copolymers of p-hydroxystyrene or p-hydroxy-α-methylstyrene and acetoxystyrene or acrylic acid and/or methacrylic acid as well as (meth)acrylates which are reacted in known manner with dihydrofuran, 3,4-dihydropyran, benzyl halides, alkyl halides, haloacetic acid, haloacetates, chlorocarbonates, alkylsulfonyl halides, aromatic sulfonyl halides, dialkyl dicarbonates or trialkylsilyl halides. Also suitable are polymers of p-(2-tetrahydropyranyl)oxystyrene or p-(tert-butoxycarbonyl)oxystyrene with (meth)acrylic acid, (meth)acrylates and/or p-acetoxystyrene as well as polymers of p-hydroxystyrene and/or p-(2-tetrahydropyranyl)oxystyrene with 3-hydroxybenzyl(meth)acrylates, which can be additionally protected by reaction with one of the above cited compounds.

A special embodiment of the inventive photoresists contains 75 to 99.5% by weight of a film-forming polymer which, when acid catalysed, contains acid-degradable groups, and 0.5 to 25% by weight of oxime sulfonates of formula (1), the percentages being based on the solids content of the compositions. Among these resists, preferred compositions contain 80 to 99% by weight of the cited polymer and 1 to 20% by weight of oxime sulfonate.

Another embodiment of the invention is a positive resist which contains 40 to 90% by weight of an acid-resistant film-forming polymer binder, 5 to 40% by weight of a monomer or polymer which, when acid catalysed, contains acid-degradable groups, and 0.5 to 25% by weight of oxime sulfonates of formula (1), the percentages being based on the solids content of the compositions. Among these resists, preferred compositions contain 50 to 85% by weight of the acid-resistant binder, 10 to 30% by weight of the monomeric or polymeric dissolution inhibitor, and 1 to 15% by weight of oxime sulfonates.

Finally, yet a further special embodiment of the invention relates to a positive resist containing a compound of formula (1) which carries at least one acid-degradable substituent, and a binder that is substantially insoluble in an alkaline developer and which, in the presence of reaction products that are formed upon acid cleavage of the cited acid-degradable substituents, becomes soluble in the developer. The amount in this case of oxime sulfonate will usually be 5 to 50% by weight, based on the solids content of the composition.

In addition to the cited componments, both the negative-working as well as the positive-working photoresist compositions may also comprise one or more than one conventional modifier for photoresists in an amount customarily used by those skilled in the art, typically selected from the group consisting of flow control agents, wetting agents, tackifiers, thixotropic agents, dyes, pigments, fillers, solubilisers, and the like. Substances that additionally sensitise the compositions to radiation in the range of the mercury i-line should, however, not be added, as such addition would normally result in an impairment of the resolution of the resist.

For application the compositions must normally additionally contain a solvent. Illustrative examples of suitable solvents are ethyl acetate, 3-methoxymethyl propionate, ethyl pyruvate, 2-heptanone, diethyl glycol dimethyl ether, cyclopentanone, cyclohexanone, γ-butyrolactone, ethyl methyl ketone, 2-ethoxyethanol, 2-ethoxyethyl acetate and, preferably, 1-methoxy-2-propylacetate. A mixture of solvents may also be used, typically of two or more of the above mentioned solvents. The choice of solvent and the concentration will depend on e.g. the type of composition and the coating method.

The solution is coated by known coating methods uniformly on to a substrate, typically by spin coating, dip coating, doctor coating, curtain coating, brushing, spraying and reverse roller coating. It is also possible to coat the light-sensitive layer on to a temporary flexible support and then to coat the final substrate by coat transfer (lamination).

The add-on (layer thickness) and type of substrate will depend on the desired field of application. The thickness range may typically be from c. 0.1 μm to more than 100 μm.

Possible utilities of the novel compositions are as photoresists in the electronics field, the production of printing plates such as offset plates or screen printing formes, mould etching and, in particular, as microresist in the production of integrated circuits. The possible substrates and conditions for processing the coated substrates differ accordingly.

When using the compositions as microresists for integrated and large-scale integrated circuits, the layer thicknesses are typically from 0.1 to 10 μm, preferably from 0.5 to 5 μm, most preferably 0.5 to 1.5 μm.

The novel compositions have excellent suitability as coating agents for substrates of all kinds, including wood, textiles, paper, ceramics, glass, plastics materials such as polyesters, polyethylene terephthalate, polyolefins or cellulose acetete, preferably in the form of films, and also of metals such as Ni, Fe, Zn, Mg Co or, preferably, Cu and Al, and of Si, silicon oxides or nitrides, on which it is desired to produce an image by imagewise exposure.

After the substrate has been coated, the solvent is normally removed by heating to give a layer of the photoresist on the substrate. The drying temperature must of course be below the temperature at which specific components of the resist could undergo thermal cure. This fact must be especially taken into account when producing the negative-working photoresists. The drying temperature should normally not exceed 80°–130° C.

Afterwards the resist coating is imagewise exposed. This exposure in a predetermined pattern to actinic light consists not only of exposure through a photomask which contains a predetermined pattern, typically a photographic transparency, but also exposure to a laser beam which is moved by logic control over the surface of the coated substrate to produce an image.

Suitable light sources in the practice of this invention are those that emit radiation of c. 340–390 nm or, preferably, of 360–390 nm, wavelength. Especially suitable is radiation of the mercury i-line of 365 nm wavelength. Suitable light sources are therefore preferably mercury vapour lamps, especially mercury medium-pressure and high-pressure lamps from the radiation of which the emission lines of other wavelengths may be filtered out. In particular, this applies to shortwave radiation. The distance between lamp and image material may vary substantially, depending on the utility and the type of lamp, for example from 2 cm to 150 cm. A particularly suitable source of laser light is conveniently the argon ion laser that emits light of 364 and 388 nm wavelength. With this type of exposure, a photomask in contact with the photopolymer layer is no longer absolutely necessary, as the the laser beam writes direct on to the layer. The high sensitivity of the novel resist compositions is very advantageous in this respect and permits high writing speeds at relatively low intensities. Upon exposure, the oxime sulfonate in the composition decomposes at the exposed areas of the coating to form sulfonic acids.

Prior to development a certain period of time is usually necessary to permit the acid-labile components of the resist composition to react. To accelerate this reaction and hence to accelerate the formation of a sufficiently pronounced difference in solubility between exposed and unexposed areas of the resist coating in the developer, the coating is preferably heated before development. Heating can also be effected or can at least begin during exposure. The preferred temperature range is from 60° to 150° C. The time required will depend on the mode of heating and can, if necessary, be readily determined by the skilled person by carrying out a few routine experiments. It will normally be from a few seconds to several minutes. For example, when using a hot plate up to 300 seconds and, when using a convection oven 1 to 30 minutes, are very suitable.

Afterwards the layer is developed and the parts of the coating that are more soluble in the developer after exposure are removed. In some cases this operation can be speeded up by gently agitating the image material, gently brushing the coating in the developer bath or spray developing. The conventional aqueous-alkaline developers of resist technology can be used for the development. Such developers typically contain sodium or potassium hydroxide, the corresponding carbonates, bicarbonates, silicates, metasilicates, but preferably metal-free bases such as ammonia or an amine, conveniently ethylamine, n-propylamine, diethylamine, di-n-propylamine, triethylamine, methyl diethylamine, alkanolamines, typically dimethyl ethanolamine, triethanolamine, quarternary ammonium hydroxides, such as tetramethylammonium hydroxide or tetraethylammonium hydroxide. The developer solutions are normally up to 0.5N, but are usually diluted before use in appropriate manner. Solutions having a normality of c. 0.1 are very useful. The choice of developer depends on the type of photoresist, especially on the type of binder used or of the photolysis products. The aqueous developer solutions may also contain minor amounts of wetting agents and/or organic solvents. Typical organic solvents which can be added to the developer solutions are cyclohexanone, 2-ethoxyethanol, toluene, acetone, isopropanol as well as mixtures of two or more of these solvents. A typical aqueous/organic developer system is butylcellosolve®/water.

The invention therefore also relates to a process for producing an image, which comprises coating a substrate with a composition of this invention, exposing the coating to radiation of 340 to 390 nm wavelength in a desired pattern and, after a heating step, removing the more readily soluble areas of the coating with an aqueous-alkaline developer.

The following Examples illustrate the invention in more detail.

EXAMPLE 1

Preparation of α-hydroxyimino-4-methoxybenzylcyanide and α-(4-tosyloxyimino)-4-methoxybenzylcyanide 64.5 g of methanol, 365 g of xylene, 80 g of sodium hydroxyde (2 mol) and 147 g (1 mol) of 4-methoxyphenylacetonitrile are charged to a reactor. Then 125 g (1.07 mol) of isopentyl nitrite are added dropwise at 40° C. over 2 hours. The reaction mixture is stirred initially for 2 hours at this temperature and then for 20 hours at room temperature. Afterwards the reaction mixture is diluted with water to form an emulsion and the pH is adjusted to 14 with aqueous sodium hydroxide and the organic phase is separated. The aqueous phase is acidified with hydrochloric acid and the product is extracted with ether. The ether phase is dried and the ether is stripped off. Recrystallisation from toluene gives 142 g of α-hydroxyimino-4-methoxybenzylcyanide, corresponding to a yield of 80.6% of theory.

The $^1$H-NMR spectrum (acetone-$d_6$) shows two symmetrical multiplets in the aromatic range at 7.06 and 7.72 ppm (4H), one singulet at 3.87 ppm (3H) and one singulet at 12.37 ppm (1H).

51.0 g (0.29 mol) of α-hydroxyimino-4-methoxybenzylcyanide and 44.0 g (0.43 mol) of triethylamine in 400 ml of tetrahydrofuran are charged to a reactor and the solution is cooled to −5° C. Then 61 g (0.32 mol) of 4-tosyl chloride (dissolved in 200 ml of tetrahydrofuran) are added dropwise over 2 hours. The reaction mixture is stirred for 3 hours at −5° C. and for a further 2 hours at c. 10° C. The tetrahydrofuran is stripped off at 30° C. under vacuum and the resultant brown crude product (88 g) is repeatedly recrystallised from acetonitrile, giving 40 g (42% of theory) of white crystals with a melting point of 141° C.

The molecular mass peak is detected in the mass spectrum at m/e 330. The $^1$H-NMR spectrum shows singulets at 2.47 ppm (3H) and 3.88 ppm (3H) as well as a multiplet (8H) in the aromatic range between 6.95 and 7.95 ppm. In the UV/VIS spectrum (measured in THF, layer thickness 1.00 cm) the band of longest wavelength has $\lambda_{max}$=319 nm (ε=14 100 l·mol$^{-1}$·cm$^{-1}$). At a wavelength of 365 nm, consistent with the mercury I-line, the absorption ε is found to be c. 230 l·mol$^{-1}$·cm$^{-1}$.

EXAMPLE 2

Positive-working Resist Based on a Polymeric Dissolution Inhibitor and Without an Acid-resistant Binder 24.7 g of a polyvinyl phenol partially silylated with trimethylsilyl groups, corresponding to the silylated phenolic resin in Example 1 of EP-A-0 329 610, and 1.4 g of the α-(4-tosyloxyimino)-4-methoxybenzylcyanide of Example 1 are dissolved in 74.0 g of 1-methoxy-2-propylacetate. After microfiltration (0.2 µm), this photoresist is spin-coated on to a silicon wafer so as to give a film with a layer thickness of 1.1 µm after a pre-exposure bake for 60 seconds at 100° C. on a hot plate. Exposure is made with a dose of 30 mJ/cm$^2$ at 365 nm through a photomask by the contact method (Canon PLA-501, Hg high-pressure lamp), the exposure energy being measured using a photodiode at 365 nm wavelength. After exposure, the resist film is given a post-exposure bake for 60 seconds at 100° C. and then developed for 60 seconds in aqueous 0.262N tetramethylammonium hydroxide (TMAH) solution. Positive images (submicrometer structures) of the photomask are obtained.

EXAMPLE 3

Positive-working Photoresist Based on a Monomeric Dissolution Inhibitor and an Acid-resistant Binder 18.2 g of polyvinyl phenol (PHM-C, supplier: Maruzen Chemicals), 8.4 g of tert-butoxycarbonyl-protected bisphenol A of formula

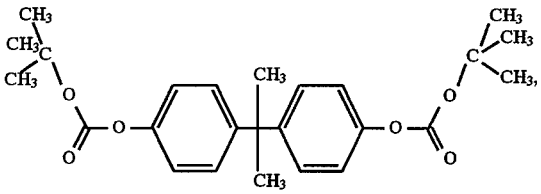

prepared by the commonly known method (e.g. J. M. J. Frechet, E. Eichler, H. Ito and C. G. Willson, Polymer, 24 (1983), 995) and 1.4 g of α-(4-tosyloxyimino)-4-methoxybenzylcyanide are dissolved in 72.0 g of 1-methoxy-2-propylacetate and the solution is subjected to microfiltration (0.2 µm). Application of the photoresist is made in accordance with the particulars of Example 2. The exposure dose is in this case 20 mJ/cm$^2$. After a post-exposure bake on a hot plate (60 seconds at 100° C.) and developing for 60 seconds with aqueous 0.131N TMAH, positive images of the mask are obtained with resolution of submicrometer structures.

EXAMPLE 4

Negative-working Photoresist 18.2 g of polyvinyl phenol (PHM-C, supplier: Maruzen Chemicals), 8.4 g of hexa(methoxymethyl)melamine (Cymel®303; supplier: Cyanamid) and 1.4 g of α(4-tosyloxyimino)-4-methoxybenzylcyanide are dissolved in 72.0 g of 1-methoxy-2-propylacetate and the solution is subjected to microfiltration through a 0.2 µm filter. The photoresist solution is applied substantially as described in Example 2. The exposure dose is 15 mJ/cm$^2$. After a post-exposure bake for 60 seconds at 115° C. on a hot plate and subsequent development with 0.262N TMAH, a negative image of the structuring mask are obtained with good resolution of submicrometer structures. The side walls of the structures obtained are vertical.

EXAMPLE 5

Negative-working Photoresist 10.1 g of m-cresol novolak, 2.6 g of hexa (methoxymethyl)melamine and 0.3 g of α-(tosyloxyimino)-4-thienylcyanide of formula

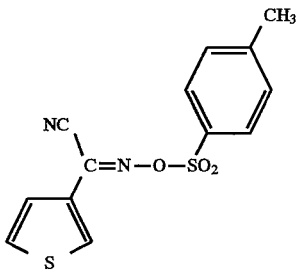

are dissolved in 31.8 g of diethylene glycol dimethyl ether and the solution is subjected to microfiltration through a 0.2 µm filter. The photoresist solution is applied substantially as described in Example 2. The exposure dose is 66 mJ/cm$^2$. After a post-exposure bake for 60 seconds at 110° C. on a hot plate and subsequent development with 0.262N TMAH, a negative image of the structuring mask are obtained with good resolution of submicrometer structures. The side walls of the structures obtained are vertical.

EXAMPLE 6

Negative-working Photoresist 4.13 g of commercially available m-cresol novolak (HRJ 2606, supplied by Schenectady), 0.75 g of tetramethoxymethyl glucoril of formula

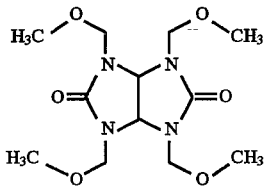

supplied by Cyanamid) and 0.12 g of α-(tosyloxyimino)-4-methoxybenzylcyanide in are dissolved in 15 g of 1-methoxy-2-propylacetate and the solution is subjected to microfiltration through a 0.2 µm filter. The resist solution is spin-coated on to a silicon wafer so as to give a film with a layer thickness of 1.2 µm after a pre-exposure bake on a hot plate. The photoresist film is exposed with a dose of 50 mJ/cm$^2$ substantially as described in Example 2. After a post-exposure bake for 60 seconds at 120° C. on a hot plate and subsequent development with aqueous 0.262N TMAH, a negative image of the structuring mask are obtained with good resolution of submicrometer structures. The side walls of the structures obtained are vertical.

What is claimed is:

1. A chemically amplified, negative-working photoresist composition containing at least one film-forming phenolic resin binder, which is developable in conventional aqueous-alkaline developers of resist technology and is based on an oxime sulfonate as radiation-sensitive photoacid generator, which photoresist composition contains as oxime sulfonate a compound of formula (1) in an amount effective to render the negative-working photoresist composition sensitive to radiation of a wavelength in the range from 340 to 390 nanometers:

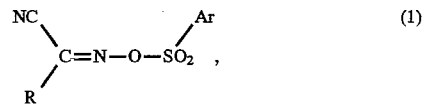

wherein

R is naphthyl,

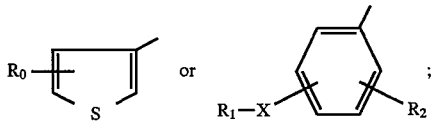

Ar is an unsubstituted aryl group or an aryl group which carries one or more than one substituent selected from the group consisting of nitro, chloro, bromo, hydroxyl, $C_1$–$C_4$alkyl, $C_1$–$C_4$perfluoroalkyl and $C_1$–$C_4$alkoxy, $R_0$ is either a $R_1$—X group or $R_2$;

X is oxygen or a sulfur atom;

$R_1$ is hydrogen, $C_1$–$C_4$alkyl or unsubstituted phenyl or phenyl which is substituted by a member selected from the group consisting of chloro, bromo, $C_1$–$C_4$alkyl and $C_1$–$C_4$alkoxy, and $R_2$ is hydrogen, chloro or $C_1$–$C_4$alkyl.

2. A negative-working photoresist composition according to claim 1, which contains an oxime sulfonate of formula (1) that does not contain any acid degradable groups, an alkali-soluble phenolic resin binder, and a component which, when acid-catalysed, undergoes a crosslinking reaction with itself and/or with the binder.

3. A negative-working photoresist composition according to claim 2, which contains 1 to 15% by weight of oxime sulfonate, 40 to 80% by weight of a phenolic resin binder, and 5 to 30% by weight of an amino resin as crosslinking agent, the percentages being based on the solids content of the composition.

4. A negative-working photoresist composition according to claim 3, which contains N-methoxymethylmelamine or tetramethoxymethyl glucoril and N,N'-dimethoxymethyluron in ultrapure or technical form as amino resin.

5. A negative-working photoresist composition according to claim 1 which contains a compound of formula (1), wherein R is

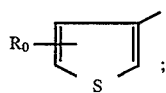

Ar is an aryl group of formula

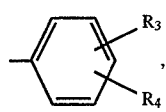

$R_3$ and $R_4$ are each independently hydrogen, chloro or methyl and $R_0$ is hydrogen.

6. A chemically amplified, negative-working photoresist composition containing at least one film-forming phenolic resin binder which is developable in alkaline medium and is based on an oxime sulfonate as radiation-sensitive photoacid generator, which photoresist composition contains as oxime sulfonate a compound of formula (1) in an amount effective to render the negative-working photoresist composition sensitive to radiation of a wavelength in the range from 340 to 390 nanometers:

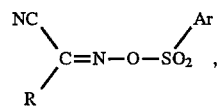

wherein R is

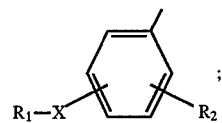

Ar is an aryl group of formula

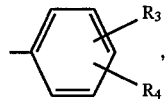

X is an oxygen atom, $R_1$ is $C_1C_4$alkyl or phenyl, and $R_2$, $R_3$, $R_4$ are each independently of one another hydrogen, chloro or methyl.

* * * * *

UNITED STATES PATENT AND TRADEMARK OFFICE
CERTIFICATE OF CORRECTION

PATENT NO. : 5,627,011
DATED : May 6, 1997
INVENTOR(S) : Münzel et al.

It is certified that error appears in the above-indentified patent and that said Letters Patent is hereby corrected as shown below:

Title page, left column, under section [73] listing Assignees, please insert --OCG Microelectronics, Inc. of West Paterson, NJ--

Signed and Sealed this

Fourth Day of November, 1997

*Attest:*

BRUCE LEHMAN

*Attesting Officer*   *Commissioner of Patents and Trademarks*